US008058917B2

(12) United States Patent
Mayer et al.

(10) Patent No.: US 8,058,917 B2
(45) Date of Patent: Nov. 15, 2011

(54) COMPENSATION OF PHASE LOCK LOOP (PLL) PHASE DISTRIBUTION CAUSED BY POWER AMPLIFIER RAMPING

(75) Inventors: Thomas Mayer, Linz (AT); Rainer Kreienkamp, Dusseldorf (DE); Jens Kissing, Boenen (DE)

(73) Assignee: Infineon Technologies AG, Neubiberg (DE)

( * ) Notice: Subject to any disclaimer, the term of this patent is extended or adjusted under 35 U.S.C. 154(b) by 37 days.

(21) Appl. No.: 12/483,708

(22) Filed: Jun. 12, 2009

(65) Prior Publication Data

US 2010/0315140 A1    Dec. 16, 2010

(51) Int. Cl.
*H03L 7/06* (2006.01)
(52) U.S. Cl. ............ 327/158; 327/156; 331/18; 331/25; 331/34; 375/373

(58) Field of Classification Search .......... 327/156–159; 331/18–19, 25, 34; 375/373, 375–376
See application file for complete search history.

(56) References Cited

U.S. PATENT DOCUMENTS

| 6,064,446 | A  | * | 5/2000 | Wissing et al. | 348/639 |
| 7,378,918 | B2 | * | 5/2008 | Hirano et al. | 332/144 |
| 7,706,495 | B2 | * | 4/2010 | Hirano et al. | 375/373 |

* cited by examiner

*Primary Examiner* — Lincoln Donovan
*Assistant Examiner* — Shikha Goyal
(74) *Attorney, Agent, or Firm* — SpryIP, LLC (57) ABSTRACT

Disclosed herein are techniques, systems, and methods relating to compensation of phase disturbances of a phase lock-loop during power ramp up or down of a power amplifier. More specifically, a phase lock-loop is described that is able to switch between type I and type II PLL modes depending on the power state of the power amplifier without introducing additional disturbances.

20 Claims, 8 Drawing Sheets

COMPENSATION OF PHASE LOCK LOOP (PLL) PHASE DISTRIBUTION CAUSED BY POWER AMPLIFIER RAMPING

BACKGROUND

Digitally controlled oscillators (DCOs) are commonly employed in a variety of applications, including communication and timing circuitry. In particular, DCOs are commonly used in phase-locked loop (PLL) systems. Functionally, a DCO may be viewed as a circuit that seeks to transform an input control voltage signal to an output voltage signal having a desired frequency.

In this case, the output signal of the PLL is normally compared against a reference signal, and a loop filter is used to tune the DCO in a manner dependent upon the comparison such that the output signal "matches" the reference signal. Such PLLs are usually used to synthesize signals at a desired frequency or, for example, to recover a clock signal from a data stream. PLLs can also be advantageously used in mobile radio for the purposes of signal modulation.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

The present application describes compensation of phase disturbances of a phase lock-loop during power ramp up or down of a power amplifier. The phase lock loops may be employed in wireless communication devices. Many specific details are set forth in the following description and in FIGS. 1-8 to provide a thorough understanding of various implementations. One skilled in the art will understand, however, that the subject matter described herein may have additional implementations, or that the concepts set forth may be practiced without several of the details described in the following description. More specifically, a system is described that is able to switch between type I and type II PLL modes depending on the power state of the power amplifier without introducing additional disturbances.

Digital Type II Phase Lock Loop

Figure 1:
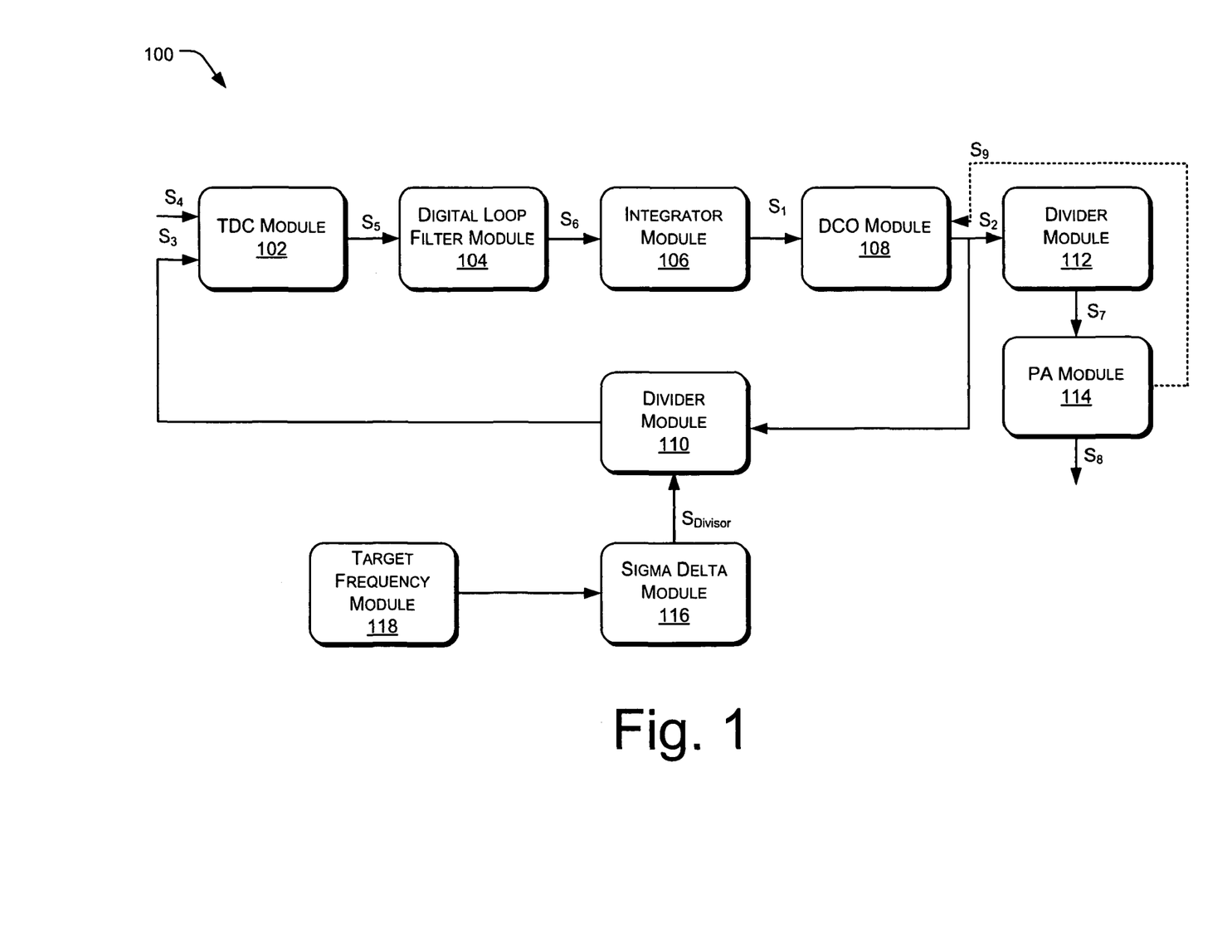
FIG. 1 is a block diagram of a digital type II phase lock-loop.

FIG. 1 shows an overview of a digital type II phase lock loop (PLL) 100. PLL 100 comprises a time to digital converter (TDC) module 102, a digital loop filter module 104, an integrator module 106, a digital controlled oscillator (DCO) module 108, a first divider module 110, a second divider module 112, a power amplifier (PA) module 114, a sigma-delta module 116, and a target frequency module 118. PLL 100 generates an output signal, via DCO module 108, that is proportional to a reference signal or within a desired frequency band of a reference signal depending upon the application desired, described further below.

DCO module 108 is configured to receive a control signal $S_1$ from integrator module 106 and generate an output signal $S_2$. Output signal $S_2$ is controlled by, and has parameters dependent upon, control signal $S_1$. More specifically, altering control signal $S_1$ alters output signal $S_2$. Thus, to obtain a desired output signal $S_2$, control signal $S_1$ is altered.

First divider module 110 is configured to receive output signal $S_2$ from DCO module 108 and reduce the frequency of output signal $S_2$ by a divisor to produce a divided signal $S_3$. The first divider module 110 is further configured to receive a signal $S_{divisor}$ that is output from target frequency module 118 via sigma-delta module 116. Signal $S_{divisor}$ contains information regarding the divisor that divider module 110 employs to reduce the frequency of output signal $S_2$. The magnitude of the divisor is determined by the application desired.

TDC module 102 is configured to receive divided signal $S_3$ from divider module 110 and further configured to receive a reference signal $S_4$. Reference signal $S_4$ may be any type of signal dependent upon the application desired. TDC module 102 determines a phase error between divided signal $S_3$ and reference signal $S_4$ (i.e. a relative phase difference between divided signal $S_3$ and reference signal $S_4$). TDC module 102 outputs this as comparison signal $S_5$.

Digital loop filter module 104 is configured to receive signal $S_5$ from TDC module 102. Digital loop filter module 104 is a low pass filter and thus limits the bandwidth of signal $S_5$ and outputs this as signal $S_6$. Integrator module 106 is configured to receive signal $S_6$ from digital loop filter module 104. Integrator module 106 accumulates the phase error within signal $S_6$ and outputs this as control signal $S_1$. As mentioned above, altering of control signal $S_1$ alters output signal $S_2$. Output signal $S_2$ is altered to have a frequency that is proportional to reference signal $S_4$ as dependent upon the application desired.

Second divider module 112 is configured to receive output signal $S_2$ from DCO module 108 and reduce the frequency of output signal $S_2$ by a divisor to produce a second divided signal $S_7$. The magnitude of the divisor is determined by the application desired. PA module 114 is configured to receive second divided signal $S_7$ and amplify signal $S_7$ and output this as amplified signal $S_8$.

Type II PLL 100 offers many advantages as compared to other types of phase lock-loops, i.e., improved noise suppression of DCO module 108. However, PA module 114 may generate an undesirable feedback signal $S_9$ that is input to and picked up by DCO module 108 and that comprises a harmonic with the same frequency of output signal $S_2$ that is output by DCO module 110. Signal $S_9$ may introduce a phase transient within PLL 100 when a power of PA module 114 is ramping up or down, which is undesirable. To that end, a digital type I phase lock loop has characteristics that may be desirable during power ramp or down of PA module 114, as described further below.

Digital Type I Phase Lock Loop

Figure 2:
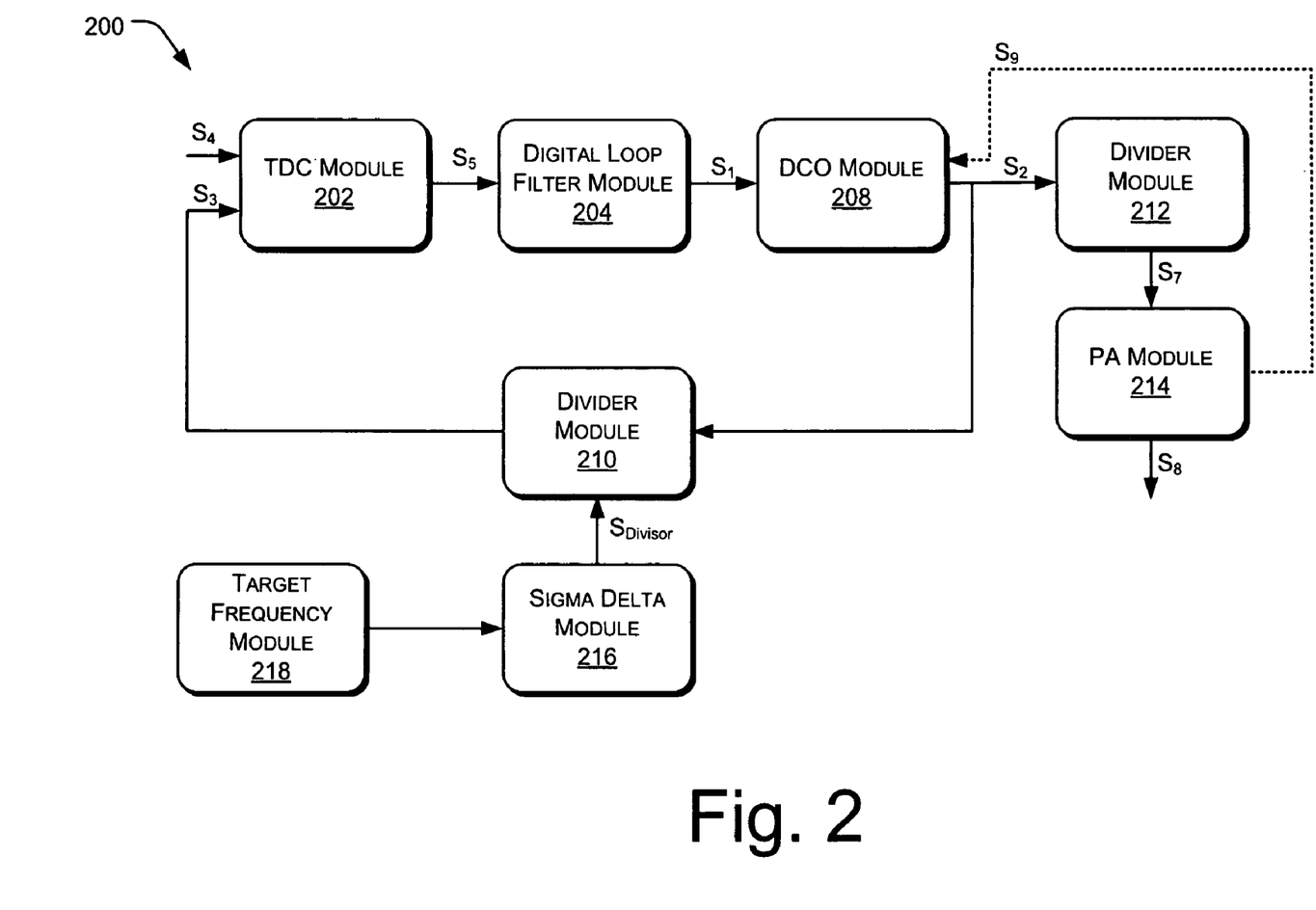
FIG. 2 is a block diagram of a digital type I phase lock-loop.

FIG. 2 shows an overview of digital type I PLL 200. Portions of PLL 200 are analogous to portions of PLL 100 mentioned above with respect to FIG. 1. More specifically, a TDC module 202, a digital loop filter module 204, a DCO module 208, a first divider module 210, a second divider module 212, a PA module 214, a sigma-delta module 216, and a target frequency module 218 are analogous to TDC module 102, digital loop filter module 104, DCO module 108, first divider module 110, second divider module 112, PA module 114, sigma-delta module 116, and target frequency module 118, respectively, of FIG. 1. As such, any reference to any portion of the analogous portions of PLL 100 may be applied analogous to the corresponding portion of PLL 200. However, PLL 200 differs slightly from PLL 100. More specifically, DCO module 208 is configured to receive signal $S_6$ that is output from digital loop filter module 204, i.e. signal $S_6$ and signal $S_1$ are substantially the same.

Type I PLL 200 offers some advantages as compared to other types of phase lock loops, i.e., improved linearity when employed as an inband phase modulator. Further, PLL 200 permits static phase deviations of DCO module 208. Since the phase error is not integrated in PLL 200, a constant phase error leads to a differing value of control signal $S_1$. Further, as a result of feedback signal $S_9$ from PA module 214 modifying the tuning characteristics of DCO module 208 by adding a frequency offset which is proportional to the power of feedback signal $S_9$, the phase error is also proportional to the power of feedback signal $S_9$. In contrast, the phase error is integrated in type II PLL 100 and thus is controlled towards zero. However, in comparison with PLL 100, PLL 200 has drawbacks in noise suppression of DCO module 208. Furthermore, PLL 200 may have phase drifts due to self-heating on the chip of PLL 200, all of which is undesirable.

It may therefore be desirable to employ PLL 200 (type I PLL) during power ramp or down of PA module 114 and employ PLL 100 when power is substantially constant for PA module 114, i.e combining the phase transient behaviors of both type I PLL and type II PLL. Thus, during power ramp up or down of PA module 114, the phase error will be approximately proportional to the power of PA module 114 but will not change upon the power of PA module 114 being substantially constant. Further, when the power has become substantially constant for PA module 114, the benefits of PLL 100 (type II PLL) are realized such as improved noise suppression of DCO module 108.

Figure 3:
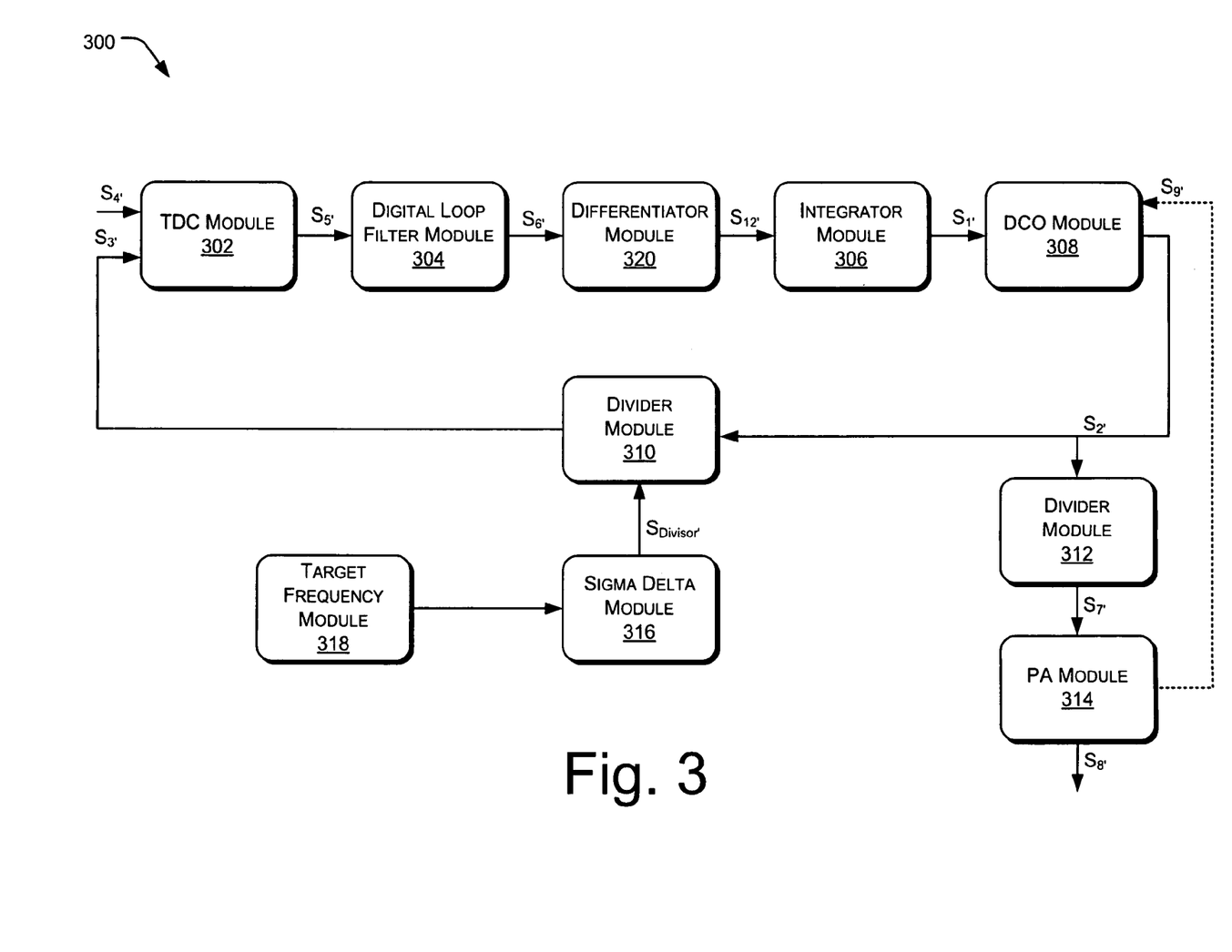
FIG. 3 is a block diagram of a phase lock-loop comprising a differentiator module.

Combining Phase Transient Behavior of Digital Type I Phase Lock Loops with Digital Type II Phase Lock Loops FIG. 3 shows an overview of a system 300 that employs the benefits of PLL 200 (type I PLL) during power ramp or down of PA module 114 and employs the benefits of PLL 100 (type II PLL) when power has become substantially constant for PA module 114. Further, system 300 is able to switch between the type I PLL mode and the type II PLL mode without generating phase transients in system 300 that may violate the phase error specification of system 300.

System 300 comprises a time to digital converter (TDC) module 302, a digital loop filter module 304, an integrator module 306, a digital controlled oscillator (DCO) 308, a first divider module 310, a second divider module 312, a power amplifier (PA) 314, a sigma-delta module 316, a target frequency module 318, and a differentiator module 320.

Switching to PLL Type I

Upon power ramp up or down of PA module 114, it may be desired to switch system 300 to PLL type I mode. In PLL type I mode, feedback signal $S_9$ is minimized, if not prevented, within system 300.

DCO module 308 is configured to receive a control signal $S_{1'}$ from integrator module 306 and generate an output signal $S_{2'}$. Output signal $S_{2'}$ is controlled by, and parameters thereof dependent, on control signal $S_{1'}$. More specifically, altering of control signal $S_{1'}$ alters output signal $S_{2'}$. Thus, to obtain a desired output signal $S_{2'}$, control signal $S_{1'}$ is altered.

First divider module 310 is configured to receive output signal $S_{2'}$ from DOC module 308 and reduce the frequency of output signal $S_{2'}$ by a divisor to produce a divided signal $S_{3'}$.

First divider module 110 is further configured to receive a signal $S_{divisor'}$ that is output from target frequency module 318 via sigma-delta module 316. Signal $S_{divisor'}$ contains information regarding the divisor that divider module 310 employs to reduce the frequency of output signal $S_{2'}$. The magnitude of the divisor is determined by the application desired.

TDC module 302 is configured to receive divided signal $S_{3'}$ from divider module 310 and further configured to receive a reference signal $S_{4'}$. Reference signal $S_{4'}$ may be any type of signal dependent upon the application desired. TDC module 302 determines a phase error between divided signal $S_{3'}$ and reference signal $S_{4'}$ (i.e. a relative phase difference between divided signal $S_{3'}$ and reference signal $S_{4'}$). TDC module 302 outputs this as comparison signal $S_{5'}$.

Digital loop filter module 304 is configured to receive signal $S_{5'}$ from TDC module 302. Digital loop filter module 304 is a low pass filter and thus limits the bandwidth of signal $S_{5'}$ and outputs this as signal $S_{6'}$. Differentiator module 320 is enabled such that it is configured to receive signal $S_{6'}$ from digital loop filter module 304.

Figure 4:
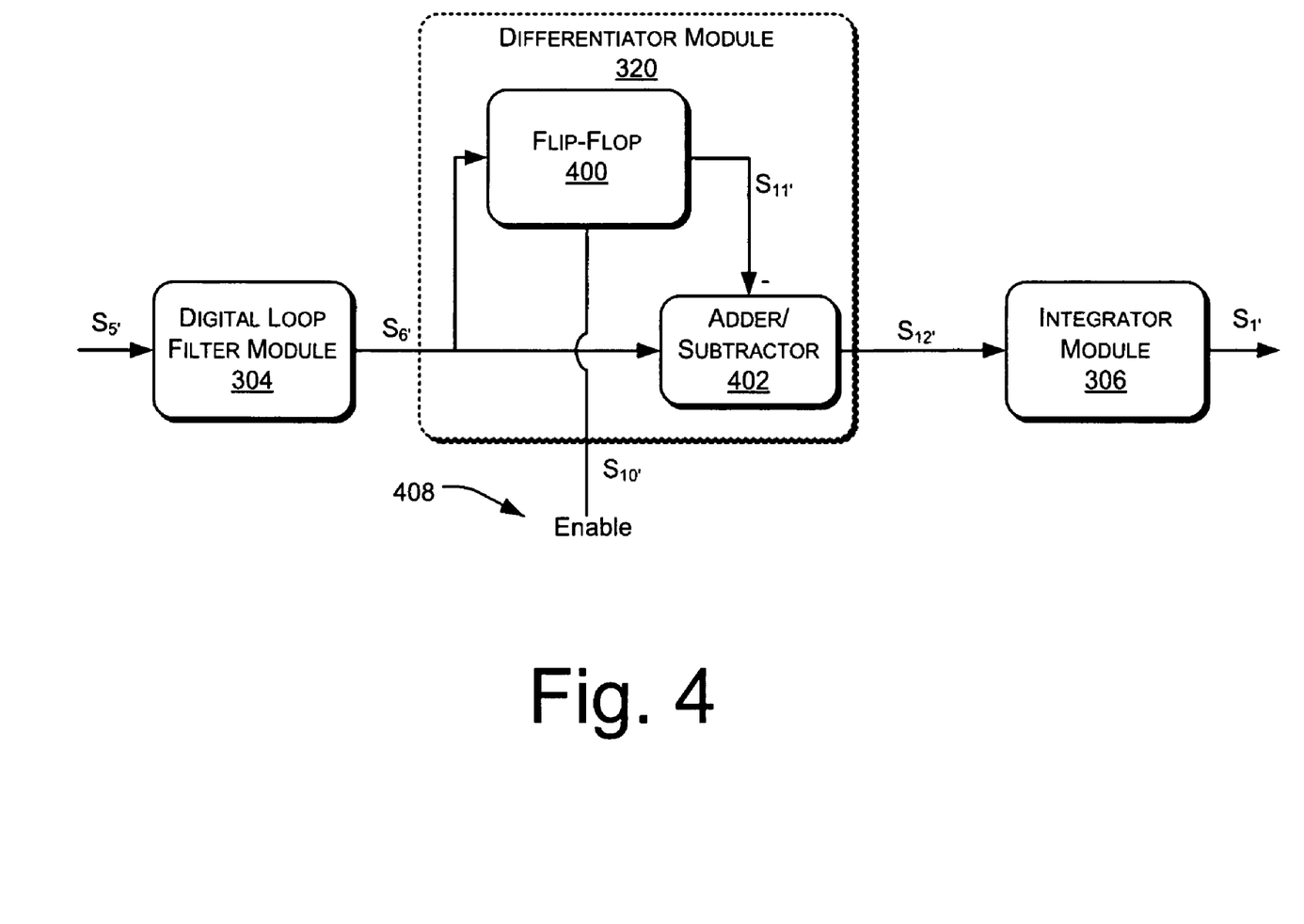
FIG. 4 is a block diagram of the differentiator module of FIG. 3.

FIG. 4 shows differentiator module 320 in further detail. Differentiator module 320 comprises a flip-flop 400 and an adder/subtractor 402. In a further implementation, differentiator module 320 comprises a plurality flip-flops depending upon the application desired. Flip-flop 400 is implemented as a D flip-flop, which is commonly known in the art, having a clock input 404, an output 406, and an enable input 408. Enable input 408 is configured to receive a signal $S_{10'}$. To that end, when signal $S_{10'}$ is set to logical high, differential module 320 is enabled. The data input D of flip-flop 400 is configured to receive signal $S_{6'}$ and output a signal $S_{11'}$. Adder/subtractor 402 is configured to receive signal $S_{11'}$ from flip-flop 400 and further configured to receive signal $S_{6'}$ from digital loop filter 304. Adder/subtractor 402 determines a difference of signal $S_{11'}$ and $S_{6'}$ and outputs this as signal $S_{12'}$. Further, as a result of signal $S_{6'}$ being constant in the locked state, output signal $S_{12'}$ of differentiator module 316 will remain at zero.

Integrator module 306 is configured to receive signal $S_{12'}$ from differentiator module 320. Integrator module 306 accumulates the phase error within signal $S_{12'}$ and outputs this as signal $S_{1'}$. As mentioned above, altering of control signal $S_{1'}$ alters output signal $S_{2'}$. Output signal $S_{2'}$ is altered to have a frequency that is proportional to reference signal $S_{4'}$ depending on the application desired. Furthermore, as a result of signal $S_{12'}$ output from differentiator module 316 remaining at zero, signal $S_{1'}$ does not change. To that end, as a result of differentiator module 316 being enabled, integrator module 306 is not active from the point of view of system 300. Thus, system 300 does not see/recognize any step during switching, as long as switching is done when the PLL phase error is settled.

Returning to FIG. 3, second divider module 312 is configured to receive output signal $S_{2'}$ from DCO module 308 and reduce the frequency of output signal $S_{2'}$ by a divisor to produce a second divided signal $S_{7'}$. The magnitude of the divisor is determined by the application desired. PA module 314 is configured to receive second divided signal $S_{7'}$ and amplify signal $S_{7'}$ and output this as amplified signal $S_{8'}$.

When differentiator module 320 is enabled, system 300 is in type I PLL mode and thus power ramp or down of PA module 314 may start. During power ramp or down of PA module 314, tuning characteristics of DCO module 308 are modified, i.e. a frequency offset proportional to feedback signal $S_{9'}$ is added to control signal $S_{1'}$. As a result of system 300 maintaining the frequency of output signal $S_{2'}$, system 300 compensates for the added frequency offset of feedback signal $S_{9'}$. Thus, signal $S_{1'}$ will be controlled such that the frequency of output signal $S_{2'}$ remains substantially constant and signal $S_{1'}$ will approximately follow the amplitude of feedback signal $S_{9'}$ proportionally. Moreover, due to the PLL digital phase error processing in Type I mode has a constant and finite gain for constant phase errors, the phase error will also be proportional to the amplitude of feedback signal $S_{9'}$.

Switching to PLL Type II

Upon the power of PA module 314 becoming substantially constant, it may be desired to switch system 300 to PLL type II mode. To switch system 300 to PLL type II mode, flip-flop 400 of differentiator module 320 is frozen. More specifically, enable signal $S_{10'}$ input to enable input 408 is set to zero. Thus, the value of flip-flop 400 within differentiator module 320 is set to hold and differentiator module 320 subtracts the last active value of signal $S_{12'}$ from signal $S_{6'}$. Thus, system 300 is in PLL type II mode as differentiator module 316 is no longer "cancelling" integrator module 308. Signal $S_{6'}$ output from digital loop filter 304 stays at the actual level while signal $S_{12'}$ input to integrator module 308 is zero. Thus, differentiator module 316 has been "bypassed" without generating a phase transient within system 300.

Transceiver Module Associated with PA Module 314

Figure 8:
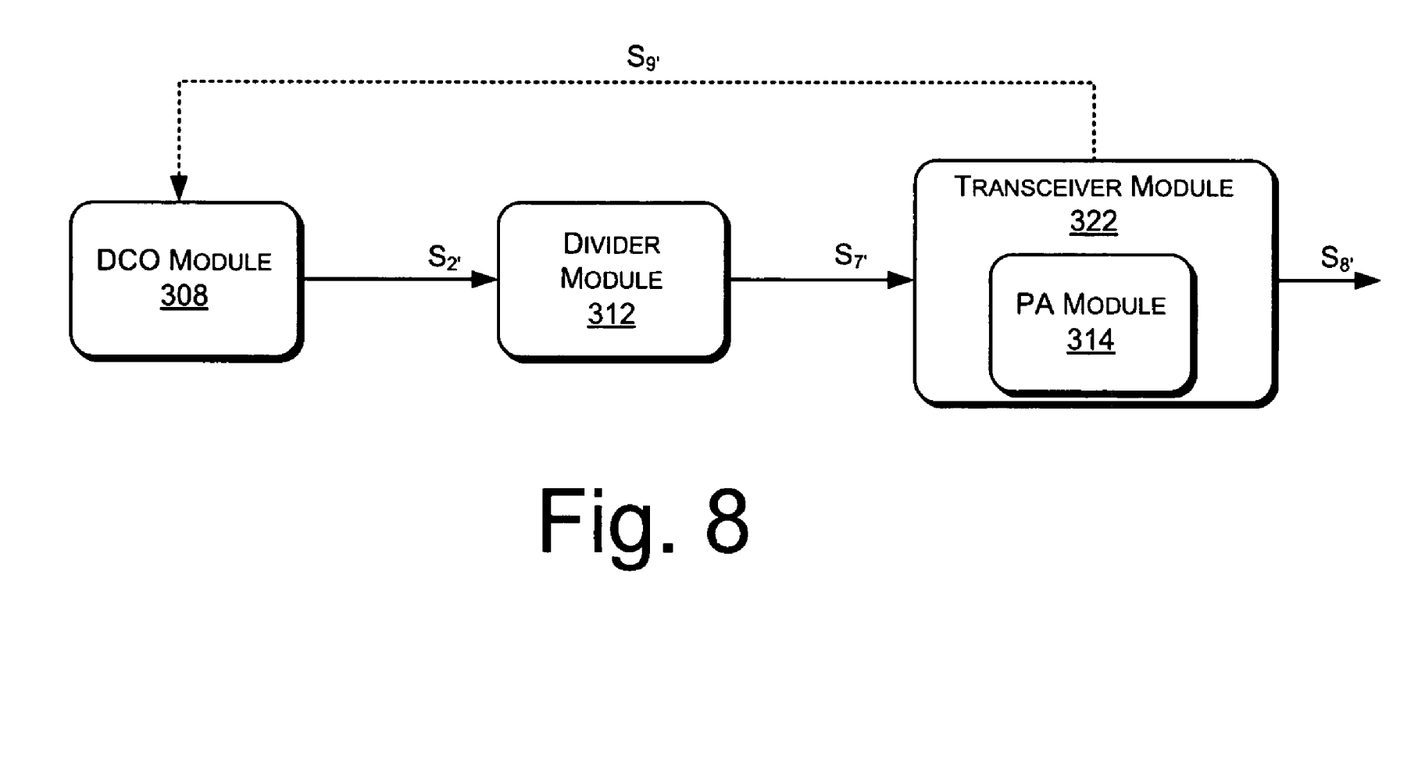
FIG. 8 is a block diagram of a transceiver module of the phase lock-loop comprising a differentiator module of FIG. 3.

In a further implementation, FIG. 8 shows system 300 comprising a transceiver module 122, with PA module 114 being associated with transceiver module 122. Transceiver module 122 is configured to receive signal $S_{7'}$. As a result, PLL 300 is switchable between type I mode and type II mode depending upon the power state of transceiver module 122 (i.e ramping or substantially constant), analogous to that above with respect to PA module 114.

PLL 200 with Switchable Digital Loop Filter

Figure 7:
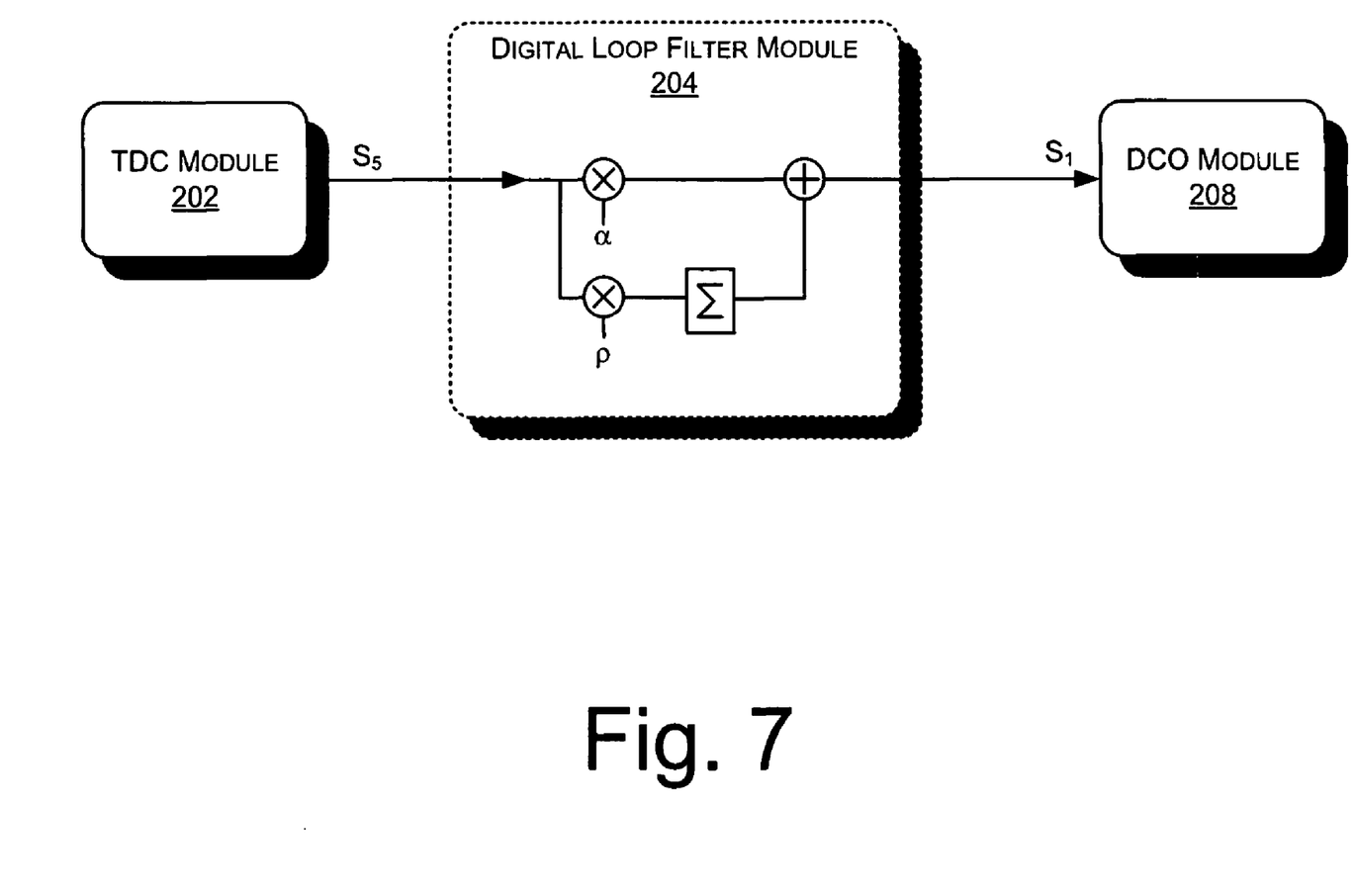
FIG. 7 is a block diagram of a digital loop filter of the digital type I phase lock-loop of FIG. 2.

Referring back to FIG. 2, in a further implementation, a transfer function of digital loop filter module 204 may be switchable to enable changing of a behavior of PLL 200, i.e. between type I mode and type II mode. FIG. 7 shows digital loop filter module 204 in more detail. More specifically, a transfer function of digital loop filter module 204 is switchable between a low pass filter with integrating behavior (pole at s=0) and a low pass filter without integrating behavior depending upon the power state of the power amplifier. When the power state of PA module 214 becomes substantially constant, the integral loop factor of digital loop filter module 204 is not zero and the transfer function of digital loop filter module 204 is switched to a low pass filter with integrating behavior and thus PLL 200 is in type II mode. When the power state of PA module 214 is ramping up or down, the integral loop factor of digital loop filter module 204 is zero and the transfer function of digital loop filter module 204 is switched to a low pass filter without integrating behavior and thus PLL 200 is in type I mode. As a result, PLL 200 is switchable between type I mode and type II mode depending upon the power state of PA module 214.

PLL 100 with Switchable Direct Connection

Referring back to FIG. 1, in a further implementation, integrator module 106 may be switchable such that integrator module 106 may be bypassed within PLL 100 depending on the power state of PA 114. More specifically, when the power state of PA module 114 becomes substantially constant, integrator module 106 is not bypassed and is coupled to DCO module 108, as described above, and thus PLL 100 is in type II mode. When the power state of PA module 114 is ramping up or down, integrator module 106 is bypassed such that digital loop filter module 104 is coupled to DCO module 108, i.e. DCO module 108 is configured to receive signal $S_6$ from digital loop filter module 104 (signal $S_6$ and signal $S_1$ are substantially the same), and thus PLL 100 is in type I mode.

As a result, PLL 210 is switchable between type I mode and type II mode depending upon the power state of PA module 114.

Timing Diagram of System 300

Figure 5:
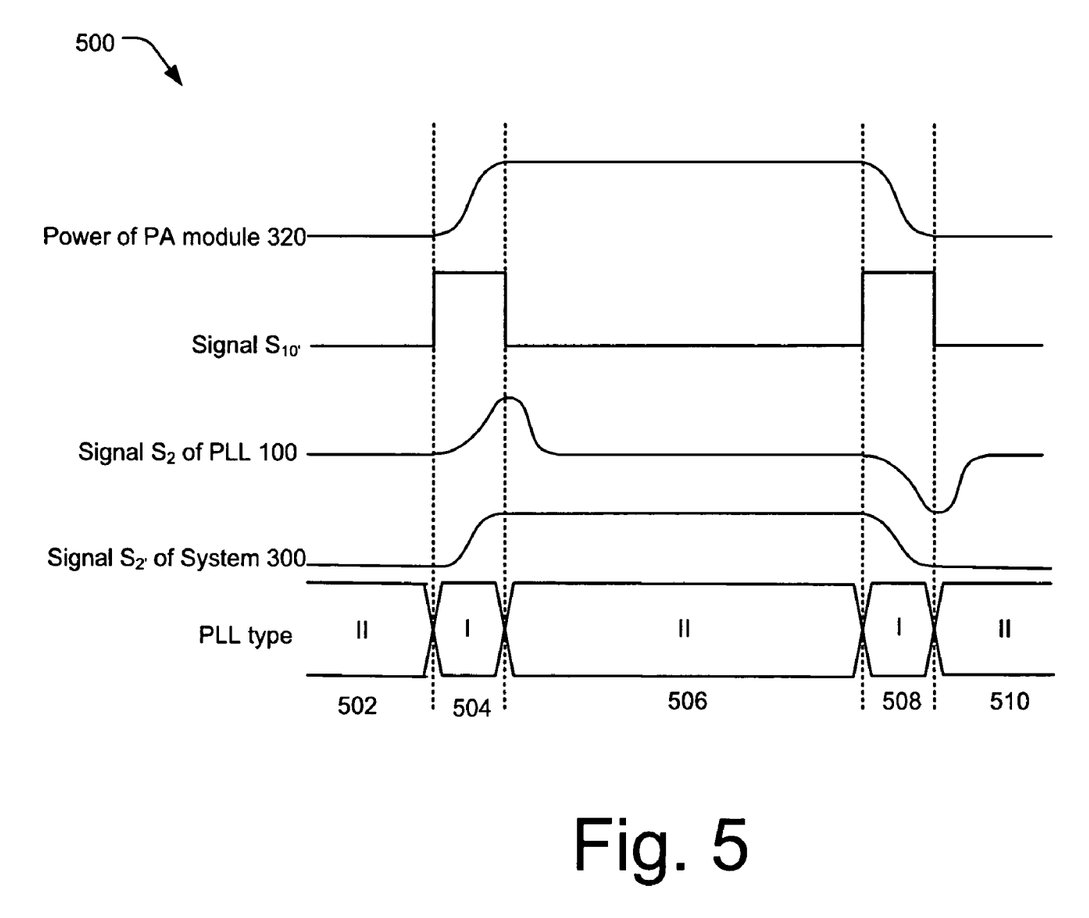
FIG. 5 is a timing diagram of the phase lock-loop of FIG. 3.

FIG. 5 shows a timing diagram 500 of the switching of system 300 between type I PLL mode and type II PLL mode. Timing diagram has 5 differing time regions 502, 504, 506, 508, and 510 of the state of the power of PA module 314.

During time region 502, the power of PA module 314 is substantially constant. Thus system 300 is in PLL type II mode and enable signal $S_{10'}$ is set to zero.

During time region 504, the power of PA module 314 is ramping up. Thus system 300 is in PLL type I mode and enable signal $S_{10'}$ is set to logical high.

During time region 506, the power of PA module 314 is substantially constant. Thus system 300 is in PLL type II mode and enable signal $S_{10'}$ is set to zero.

During time region 508, the power of PA module 314 is ramping down. Thus system 300 is in PLL type I mode and enable signal $S_{10'}$ is set to logical high.

During time region 510, the power of PA module 314 is substantially constant. Thus system 300 is in PLL type II mode and enable signal $S_{10'}$ is set to zero.

Further, timing diagram 500 shows output signal $S_2$ of PLL 100 and output signal $S_{2'}$ of system 300 versus the power state of PA module 314. As is evident, a phase transient is introduced in PLL 100 after power ramp up or down while system 300 operates without any disturbances.

Process Model 600

Figure 6:
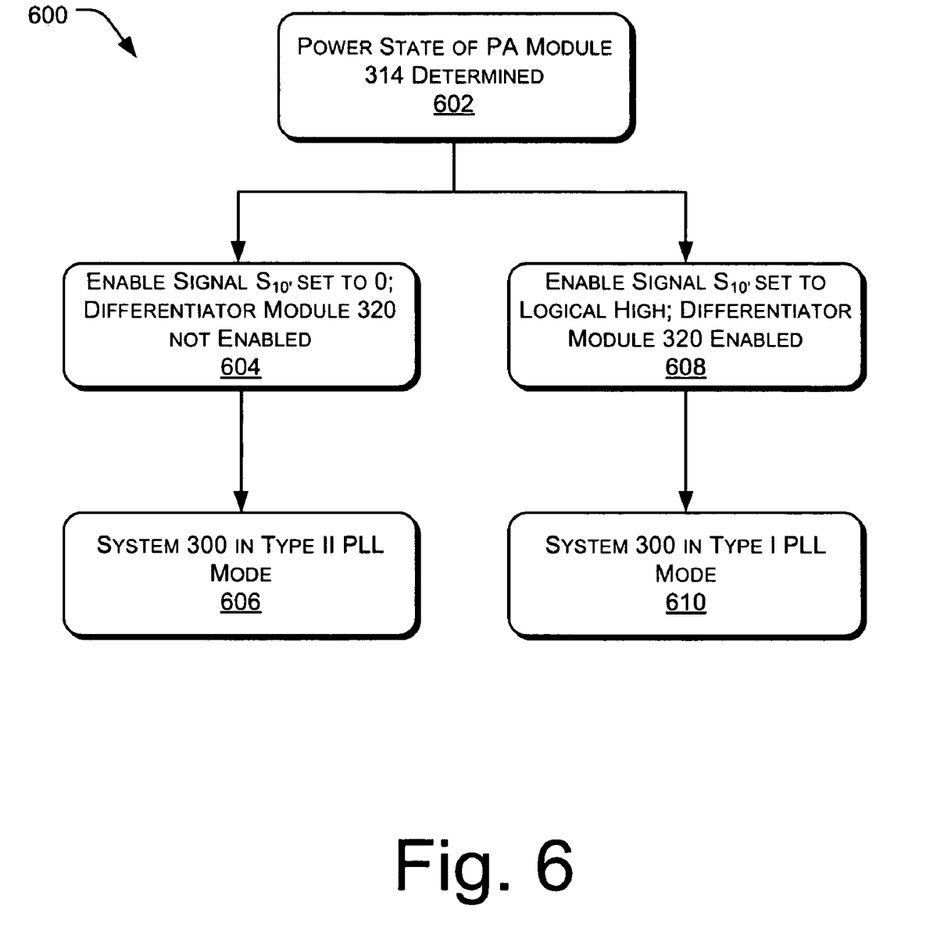
FIG. 6 is a flowchart employing the system of FIG. 3.

FIG. 6 shows a method 600 of employing system 300. The process 600 is illustrated as a collection of referenced acts arranged in a logical flow graph, which represent a sequence that can be implemented in hardware, software, or a combination thereof. The order in which the acts are described is not intended to be construed as a limitation, and any number of the described acts can be combined in other orders and/or in parallel to implement the process.

At step 602, a power state of PA module 314 is determined. The power state being either ramping up/down or constant.

At step 604, if the power of PA module 314 is constant, enable signal $S_{10'}$ is set to zero that is input to differentiator module 316. Thus, differentiator module 316 is not enabled.

At step 606, system 300 is in type II PLL mode.

At step 608, if the power of PA module 314 is ramping up/down, enable signal $S_{10'}$ is set to logical high that is input to differentiator module 316. Thus, differentiator module 316 is enabled.

At step 610, system 300 is in type I PLL mode.

CONCLUSION

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A system comprising:
    a power amplifier; and
    a phase lock loop comprising:
        an integrator module to generate a control signal, with the control signal altering an output signal of the phase lock loop such that the output signal is locked to a reference signal, the power amplifier receiving the output signal; and a differentiator module selectively enabled such that the phase lock loop is switchable between a type I mode and a type II mode depending upon a power state of the power amplifier, the differentiator module comprising a flip-flop to be enabled during power ramp or power down of the power amplifier, and the flip-flop to be disabled during a substantially constant power state of the power amplifier.

2. The system of claim 1 further comprising a digitally controlled oscillator (DCO) module to receive the control signal and generate the output signal.

3. The system of claim 2 further comprising a time-to-digital (TDC) converter module configured to determine a relative phase difference between the output signal and the reference signal to define a comparison signal.

4. The system of claim 3 further comprising a digital loop filter module configured to receive the comparison signal and generate a first signal based upon the comparison signal.

5. The system of claim 4 wherein the integrator module further accumulates the phase error in the first signal to generate the control signal.

6. The system of claim 5 wherein the differentiator module is coupled between the integrator module and the digital loop filter.

7. The phase lock loop of claim 1 wherein the power amplifier generates a feedback signal comprising a harmonic with the same frequency of the output signal.

8. The phase lock loop of claim 1 wherein the power amplifier amplifies the output signal.

9. The phase lock loop of claim 1 wherein the phase lock loop is switchable without generating additional disturbances within the phase lock loop.

10. A phase lock loop comprising:
a digitally controlled oscillator (DCO) module to receive a control signal and generate an output signal;
a power amplifier module to receive the output signal;
a time-to-digital (TDC) converter module configured to determine a relative phase difference between the output signal and a reference signal to define a comparison signal;
a digital loop filter module configured to receive the comparison signal and generate a first signal based upon the comparison signal;
an integrator module to accumulate the phase error in a second signal and generate the control signal, with the control signal altering the output signal such that the output signal is locked to the reference signal; and
a differentiator module coupled between the integrator module and the digital loop filter, the differentiator module comprising a flip-flop having an enable input and an adder/subtractor, wherein the flip-flop is selectively enabled such that:

i) when enabled, the adder/subtractor determines a difference between the first signal and a third signal that is output by the flip-flop and outputs this difference as the second signal, the phase lock loop being in a type I mode; and ii) when not enabled, the adder/subtractor determines a difference between the first signal and a previous value of the third signal that is output by the flip-flop and outputs this difference as the second signal, the phase lock loop being in a type II mode.

11. The phase lock loop of claim 10 wherein the differentiator module is switchable between the type I mode and the type II mode depending upon a power state of the power amplifier.

12. The phase lock loop of claim 10 wherein the power amplifier generates a feedback signal comprising a harmonic with the same frequency of the output signal.

13. The phase lock loop of claim 10 wherein the power amplifier amplifies the output signal.

14. The phase lock loop of claim 10 wherein the phase lock loop is switchable without generating additional disturbances within the phase lock loop.

15. The phase lock loop of claim 10 wherein the flip flop is a D flip flop.

16. A wireless device comprising the phase lock loop of claim 10.

17. A system comprising:
a power amplifier; and
a phase lock loop comprising:
a digital loop filter module to generate a control signal, with the control signal altering an output signal of the phase lock loop such that the output signal is locked to a reference signal, the power amplifier receiving the output signal; and
with a transfer function of the digital loop filter module being switchable between a low pass filter with integrating behavior (pole at s=0) and a low pass filter without integrating behavior to enable changing of a behavior of the phase lock loop depending upon a power state of the power amplifier.

18. The system of claim 1 wherein the differentiator module further includes an adder/subtractor.

19. The system of claim 1 wherein the flip-flop is configured to disable the differentiator module during the type II mode of operation.

20. The system of claim 1 wherein the flip-flop is configured to disable the integrator module during the type I mode of operation.

* * * * *